United States Patent
Yamada

(10) Patent No.: US 8,056,020 B2
(45) Date of Patent: Nov. 8, 2011

(54) METHOD OF DESIGNING SEMICONDUCTOR INTEGRATED CIRCUIT AND MASK DATA GENERATION PROGRAM

(75) Inventor: Kenta Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 651 days.

(21) Appl. No.: 12/219,057

(22) Filed: Jul. 15, 2008

(65) Prior Publication Data

US 2009/0024968 A1 Jan. 22, 2009

(30) Foreign Application Priority Data

Jul. 17, 2007 (JP) ................................. 2007-186191

(51) Int. Cl.
*G06F 17/50* (2006.01)
*G06F 11/22* (2006.01)

(52) U.S. Cl. ............................. 716/50; 716/55; 716/136

(58) Field of Classification Search .................. 716/136, 716/50, 55
See application file for complete search history.

(56) References Cited

U.S. PATENT DOCUMENTS

| | | | |
|---|---|---|---|
| 5,847,967 A | 12/1998 | Asao | |
| 6,363,516 B1 | 3/2002 | Cano et al. | |
| 6,953,696 B2 * | 10/2005 | Yamauchi | 438/5 |
| 7,231,626 B2 | 6/2007 | Hoff et al. | |
| 7,360,191 B2 | 4/2008 | Chang et al. | |
| 7,482,671 B2 * | 1/2009 | Toda et al. | 257/510 |
| 2005/0108666 A1 | 5/2005 | Chang et al. | |
| 2005/0132306 A1 | 6/2005 | Smith et al. | |
| 2006/0010409 A1 | 1/2006 | Tamaki et al. | |
| 2006/0142987 A1 | 6/2006 | Ishizu et al. | |
| 2006/0184908 A1 | 8/2006 | Minami et al. | |
| 2007/0026627 A1 | 2/2007 | Kim | |
| 2007/0033558 A1 | 2/2007 | Nakagawa et al. | |
| 2007/0094623 A1 | 4/2007 | Chen et al. | |
| 2007/0132056 A1 * | 6/2007 | Williams | 257/510 |
| 2007/0136705 A1 | 6/2007 | Hosono | |

FOREIGN PATENT DOCUMENTS

| | | |
|---|---|---|
| JP | 2003-23080 | 1/2003 |
| JP | 2006-178907 | 7/2006 |
| JP | 2007-36249 | 2/2007 |

OTHER PUBLICATIONS

Kenta Yamada, USPTO Notice of Allowance, U.S. Appl. No. 12/219,058, Nov. 26, 2010, 11 pages.
U.S. Appl. No. 12/219,056, filed Jul. 15, 2008, NEC Electronics Corp.
U.S. Appl. No. 12/219,058, filed Jul. 15, 2008, NEC Electronics Corp.
Kenta Yamada, UPSTO Office Action, U.S. Appl. No. 12/219,056, Mar. 11, 2011, 11 pages.

* cited by examiner

*Primary Examiner* — Thuan Do
*Assistant Examiner* — Magid Dimyan
(74) *Attorney, Agent, or Firm* — Foley & Lardner LLP

(57) ABSTRACT

A method of designing a semiconductor integrated circuit includes: generating a layout data indicating a layout; and generating a mask data based on the layout data. The generating the mask data includes: referring to the layout data to extract a parameter that specifies a layout pattern around a target transistor included in the semiconductor integrated circuit, wherein the parameter includes at least a width of a device isolation structure around the target transistor; correcting a gate length and a gate width of the target transistor to offset a variation of a characteristic of the target transistor from a design value, the variation depending on the extracted parameter; and generating the mask data from the layout data in which the gate length and the gate width are corrected.

10 Claims, 14 Drawing Sheets

PATTERN DEPENDENCE CONSIDERATION TOOL

Fig. 9
MEASUREMENT DATA
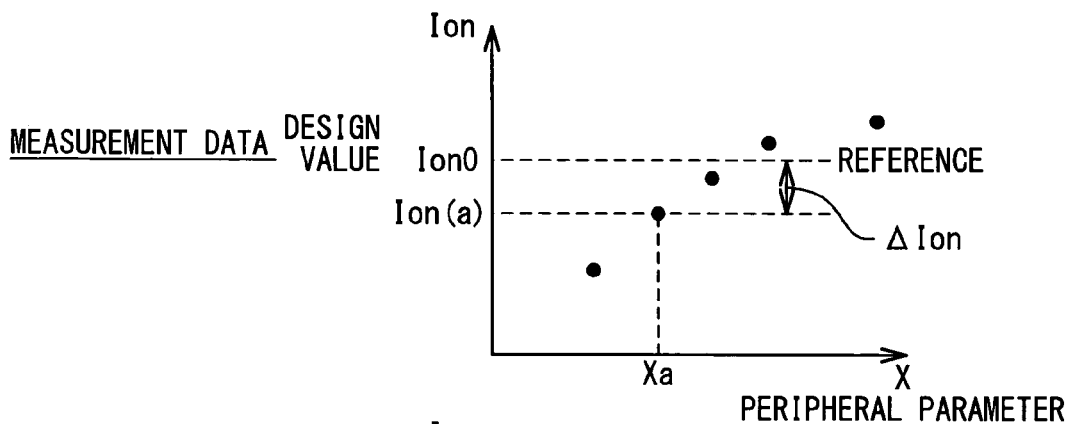
DEVICE DATA
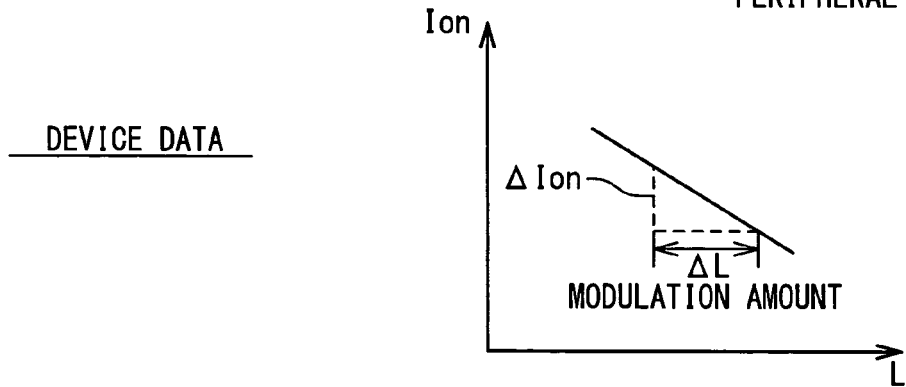
MODULATION FUNCTION
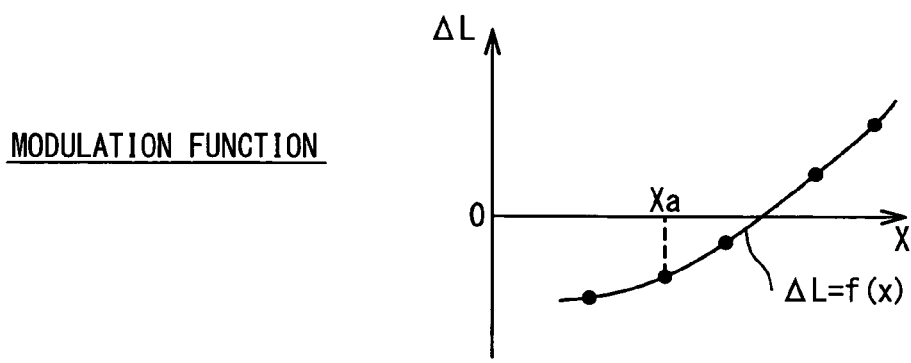

ing tool will be considered. FIG. 2 is a flow chart showing a conventional design method. Japanese Laid-Open Patent Application JP-2007-36249 is also cited as reference.

METHOD OF DESIGNING SEMICONDUCTOR INTEGRATED CIRCUIT AND MASK DATA GENERATION PROGRAM

INCORPORATION BY REFERENCE

This application is based upon and claims the benefit of priority from Japanese patent application No. 2007-186191, filed on Jul. 17, 2007, the disclosure of which is incorporated herein in its entirely by reference.

BACKGROUND OF THE INVENTION

1. Field of the Invention

The present invention relates to a design technique for a semiconductor integrated circuit. In particular, the present invention relates to a design technique in which layout around an element is considered.

2. Description of Related Art

Characteristics of a transistor depend on "device parameters" such as gate length L, gate width W, mobility μ, threshold voltage Vt and the like. When the transistor is actually manufactured, those device parameters are likely to vary from design values. The variations of the device parameters from the design values lead to variations of the transistor characteristics from expected values. It is therefore important to sufficiently consider variation factors of the device parameters at circuit design, verification and manufacturing stages.

For example, a typical variation factor of a gate size (L and W) is OPE (Optical Proximity Effect) in photolithography processes. Due to the OPE, a resist pattern may not be formed as intended, which causes deviations of interconnection width and gate size from the design values. In particular, the variation from the design value caused by the OPE becomes more conspicuous with increasing miniaturization of semiconductor manufacturing processes. Also, the OPE becomes remarkable in a case of a high pattern density. Therefore, OPC (Optical Proximity Correction) is generally performed, in which the OPE is estimated to correct a mask data in advance (refer to US Publication 2007/0033558, for example).

Japanese Laid-Open Patent Application JP-2003-23080 discloses a technique to change a buffer cell depending on cell density in order to obtain a desired chip speed. More specifically, plural types of buffer cells having different driving capability are first prepared, and then driving capability of a buffer cell is changed at a layout design stage depending on the cell density.

Moreover, a layout pattern (or structure) surrounding a transistor can affect device parameters and characteristics of the transistor. Such a peripheral factor affecting the characteristics includes: (1) gate pitch; (2) well proximity effect; and (3) STI stress, for example.

(1) The gate pitch is an interval between a gate of a transistor and a gate of the adjacent transistor. The gate pitch affects, for example, ion dose in an ion injection process. It is known that ON-current becomes larger as the gate pitch becomes smaller while ON-current becomes smaller as the gate pitch becomes larger.

(2) The well proximity effect is described, for example, in Japanese Laid-Open Patent Application JP-2007-36249. More specifically, in a well ion injection process, a part of the injection ions collide with an edge of a resist pattern to be scattered. The scattered ions intrude into an active region of the transistor, which varies the threshold voltage Vt from the design value. This is the well proximity effect. The influence of the well proximity effect becomes larger, as an interval between an edge of the well and an edge of the active region becomes smaller.

(3) The STI stress, which is stress imposed on a transistor from an STI (Shallow Trench Isolation) that is a device isolation structure, affects the mobility μ in a channel (refer to Japanese Laid-Open Patent Application JP-2006-178907) When a width of the STI becomes narrower, the STI stress is increased, and thereby the mobility μ and the ON-current are changed.

As described above, a peripheral pattern (peripheral structure) around a transistor causes variation of the transistor characteristics from the design values. That is to say, the transistor characteristics have "peripheral pattern dependence". If the peripheral pattern is different between transistors, the characteristics of the transistors after manufacturing may become different, even if the transistors have the same design. It is therefore important to consider the peripheral pattern dependence of transistor at the semiconductor integrated circuit design and verification stages.

Japanese Laid-Open Patent Application JP-2006-178907 discloses a method of circuit simulation in which the STI width is considered. According to the circuit simulation, the mobility μ which is one of model parameters of a transistor is corrected depending on the STI width. More specifically, an approximate expression that expresses a relationship between the STI width and the mobility μ is created beforehand based on actually measured values or the like. Prior to the circuit simulation, a designed STI width (design value) is extracted based on the circuit layout. Then, the mobility μ as the model parameter is corrected by using the extracted STI width and the above-mentioned approximate expression. After that, the circuit simulation is performed by using the corrected model parameter. Consequently, the transistor characteristics dependent on the STI width are considered and accuracy of the circuit simulation is improved.

In this context, a tool is commercially available that modulates (corrects) a SPICE netlist used in a SPICE simulation in consideration of the peripheral pattern dependence. The tool is hereinafter referred to as "pattern dependence consideration tool".

FIG. 1 is a schematic diagram for explaining a function of the pattern dependence consideration tool. First, a model (e.g. Δμ=f(X)) that expresses a relationship between graphical information (e.g. STI width X) and modulation amount (e.g. Δμ) of a SPICE model parameter is created through evaluation of TEG (Test Element Group). After that, the SPICE simulation of a cell is performed.

Prior to the SPICE simulation, the pattern dependence consideration tool reads a SPICE netlist (pre-modulation cell netlist) of a target cell and a layout data (cell layout data) of the target cell. Subsequently, the pattern dependence consideration tool extracts the graphical information (X) from the cell layout data, and rewrites (modulates) the SPICE model parameter included in the pre-modulation cell netlist with reference to the above-mentioned model (Δμ=f(X)). As a result, a post-modulation cell netlist that is a SPICE netlist after the rewriting is generated. In the SPICE simulation, the post-modulation cell netlist output from the pattern dependence consideration tool is used. Since the peripheral pattern dependence of transistor is reflected in the SPICE netlist, the simulation accuracy is dramatically improved. It should be noted that the SPICE model parameter to be modulated is not limited to the mobility μ but can include the gate length L, the gate width W, the threshold voltage Vt or the like.

Next, a method of designing and verifying a semiconductor integrated circuit by utilizing the pattern dependence consideration tool will be described with reference to FIG. 2. The pattern dependence consideration tool is used at a cell characterization stage. As mentioned above, the pattern dependence consideration tool rewrites the pre-modulation cell netlist based on the cell layout data to generate the post-modulation cell netlist. After that, the SPICE simulation is performed by using the post-modulation cell netlist, and a delay value (expected value) of the cell is calculated. At this time, a gate size and the like of the transistor are set to corner values in consideration of manufacturing variability. As a result, cell delay values corresponding to the manufacturing variability can be obtained. A corner delay value is extracted from the calculated cell delay values, and a cell delay library that provides the corner delay value is generated. In this manner, the cell characterization is performed.

At the design/verification stage, a placement and routing tool performs cell placement and routing based on a netlist of a design circuit. As a result, a layout data indicating layout of the design circuit is generated. Next, a delay calculation tool reads the netlist, the generated layout data and the above-mentioned cell delay library, and calculates delay values in the design circuit. More specifically, the delay calculation tool calculates delay values of inter-cell interconnections, based on RC extracted from the layout data. The cell delay values (corner delay values) of cells are obtained from the cell delay library. Thus, a delay file indicating the cell delay values and path delay values is generated.

Next, delay verification (timing verification) of the design circuit is performed. More specifically, the STA tool performs an STA (Static Timing Analysis) based on the netlist and the generated delay file. If the verification result is "FAIL", the above-described placement and routing process is performed again to modify the layout data. The same processing is repeated until the verification result becomes "PASS".

With regard to the method shown in FIG. 2, there are the following problems. FIG. 3 is a schematic diagram for explaining the problems, showing one example of a cell layout used at the characterization stage. As an example, let us consider a primitive cell such as a NAND gate, an inverter or the like. The cell shown in FIG. 3 has PMOS transistors P1 to P3 and NMOS transistors N1 to N4 which are formed in a region sandwiched between a power supply line VDD and a ground line GND. The PMOS transistor P1 has diffusion regions PD1 and PD2 that are in contact with an STI. The PMOS transistors P2 has diffusion regions PD3 and PD4 that are in contact with the STI. A distance between diffusion regions of the respective PMOS transistors P1 and P2 that are placed adjacent to each other, namely, a distance X2 between the diffusion regions PD2 and PD3 is the "STI width".

According to the method shown in FIG. 2, the pattern dependence consideration tool extracts the graphical information (e.g. STI width X) from the cell layout data to calculate the modulation amount (e.g. $\Delta\mu$) of the SPICE model parameter. As to the PMOS transistor P2 shown in FIG. 3, the peripheral layout pattern (e.g. STI width X2) is already known and thus the SPICE model parameter can be modulated. As to the PMOS transistor P1 placed at the outermost of the cell, on the contrary, not all peripheral layout pattern is known at the characterization stage where surrounding cells (cells on the left and right sides) are not placed yet. In FIG. 3, for example, an STI width X1 on the left side of the PMOS transistor P1 is not known at the characterization stage but becomes known at the subsequent cell placement process. Therefore, it is not possible to module the SPICE model parameter of the PMOS transistor P1 prior to the SPICE simulation. The same applies to the PMOS transistor P3, the NMOS transistors N1 and N4.

In this manner, with regard to a transistor placed at an inward area of the cell, it is possible by the above-described method to consider the peripheral pattern dependence in the SPICE simulation. However, with regard to the outermost transistor placed near the cell boundary, it is not possible to consider the peripheral pattern dependence in the SPICE simulation since the peripheral layout pattern is unknown. In other words, the peripheral pattern dependence cannot be fully considered at least with respect to the characteristics of the outermost transistor. Since the transistor characteristics affect the cell delay value, it cannot be said that the peripheral pattern dependence is fully considered in the generated cell delay library. Consequently, it cannot be said that the accuracy of the delay verification (STA) is sufficient. This contributes to reduction of yield and reliability of the semiconductor integrated circuit to be manufactured.

In view of the above-described problems, the following two new methods are suggested as alternatives to the method shown in FIG. 2.

According to the first method, types of cells adjacent to a target cell are assumed at the characterization stage for the target cell. The pattern dependence consideration tool modulates the cell netlist based on layout data of the assumed adjacent cells in addition to the cell layout data of the target cell. The resultant post-modulation cell netlist is used in the SPICE simulation so that the cell delay value of the target cell is calculated. The same processing is repeated with setting the adjacent cell type variously (for each of prepared types). As a result, plural kinds of cell delay values corresponding to respective combinations of the adjacent cells are obtained. Then, the cell delay library is generated based on the obtained plural kinds of cell delay values. The peripheral pattern dependence of the outermost transistors in the cell is considered in the generated cell delay library. However, the time (TAT) required for the cell characterization is increased as compared with that in the method shown in FIG. 2.

Furthermore, the first method is disadvantageous in that the corner condition of the cell delay value becomes stricter as compared with that in the method shown in FIG. 2. FIG. 4 schematically shows the corner condition (corner delay value) provided by the cell delay library. According to the method shown in FIG. 2, a delay value distribution corresponding to only the normal manufacturing variability is obtained. According to the first method, on the contrary, the various types of adjacent cells are assumed and thus a plurality of delay value distributions having different center delay values are obtained. Therefore, a variability range of the delay value of each cell is expanded as compared with the case where the adjacent cells are not assumed. That is to say, a "margin" corresponding to the difference of the combination of adjacent cells is further added to the variability range of the delay value of each cell. This means that the corner condition (corner delay value) becomes stricter.

At the circuit design/verification stage, it is necessary to perform the layout design such that the design circuit can operate even in the corner condition. In other words, it is necessary to repeat the layout design and delay verification until the design circuit operates in the corner condition. Therefore, when the corner condition becomes stricter, the number of the repetition times is inevitably increased and thus the time (TAT) required for the circuit design/verification is increased. Moreover, since the margin is added to the cell delay value such that every adjacent cell types can be supported, it is necessary to increase driving capability of transistors and/or to additionally insert redundant cells. This leads to increase in a chip area and power consumption. According to the first method, as described above, the design/verification TAT, chip area and power consumption are increased although the peripheral pattern dependence is fully considered.

According to the second method, the cell characterization is performed as in the case of the method shown in FIG. 2. As a result, the cell delay library in which the peripheral pattern dependence is partially considered is generated. After that, the pattern dependence consideration tool is utilized again at the circuit design/verification stage. More specifically, the pattern dependence consideration tool modulates the SPICE netlist of each cell with reference to the chip-level layout data generated in the placement and routing process. Subsequently, the SPICE simulation of each cell is performed again by using the post-modulation netlist, and a "difference (variation)" from the cell delay value given by the cell delay library is calculated. The calculated difference is reflected in the delay file. In this manner, the peripheral pattern dependence can be considered with regard to the outermost transistor in the cell.

The same processing is repeated for all cells (for example, millions of cells) included in the design circuit. That is to say, the modulation of the SPICE netlist and the SPICE simulation are executed for millions of times at the cell design/verification stage. Thus, the design/verification TAT is increased also in the second method, although the peripheral pattern dependence is fully considered.

According to the related techniques, as described above, while the peripheral pattern dependence is considered, the design/verification TAT is increased. A technique is desired which can prevent the increase in the design/verification TAT for the semiconductor integrated circuit, while considering the peripheral pattern dependence of the transistor characteristics sufficiently.

SUMMARY

In a first aspect of the present invention, a method of designing a semiconductor integrated circuit is provided. The method includes: (A) generating a layout data indicating a layout of the semiconductor integrated circuit; and (B) generating a mask data of the semiconductor integrated circuit based on the layout data. In generating the mask data, the peripheral pattern dependence of transistor characteristics is considered.

More specifically, the above-mentioned (B) step includes: referring to the layout data to extract a parameter that specifies a layout pattern around a target transistor included in the semiconductor integrated circuit. The parameter is related to the peripheral pattern dependence and includes at least a width of a device isolation structure around the target transistor. The (B) step further includes: correcting a gate length and a gate width of the target transistor to offset a variation of a characteristic of the target transistor from a design value, the variation depending on the extracted parameter; and generating the mask data from the layout data in which the gate length and the gate width are corrected.

In this manner, the gate length and gate width are corrected at the mask data generation stage, and thereby variation of the transistor characteristics caused by the peripheral pattern dependence can be cancelled. In particular, the width of the device isolation structure is considered as the parameter related to the peripheral pattern dependence. Therefore, variation of the transistor characteristics caused by at least the STI stress can be cancelled.

It can also be said that the variation of the transistor characteristics caused by the peripheral pattern dependence is substituted with modulation amounts of the gate length and gate width of the transistor. In other words, influence of the STI stress and the well proximity effect is represented by the modulation amounts of the gate length and gate width. It is therefore possible to correct (modulate) the gate length and gate width at the mask data generation stage to offset (cancel) the influence of the peripheral pattern dependence.

According to the present invention, as described above, the peripheral pattern dependence of the transistor characteristics is fully considered. Thus, yield and reliability of the semiconductor integrated circuit to be manufactured are improved. Moreover, increase in the characterization TAT and the design/verification TAT can be prevented, because the peripheral pattern dependence is considered at the mask data generation stage.

Furthermore, it is not necessary to add the margin such as shown in FIG. 4, since the peripheral pattern dependence needs not be considered at the cell characterization stage. As a result, the number of repetition times of the layout design and delay verification is prevented from being increased. Therefore, the increase in the design/verification TAT can be prevented. Moreover, it is not necessary to increase driving capability of transistors and/or to additionally insert redundant cells. Therefore, the increase in the chip area and power consumption can be prevented.

In a second aspect of the present invention, a mask data generation program recorded on a computer-readable medium is provided. When executed, the mask data generation program causes a computer to perform a method of generating a mask data from a layout data of a semiconductor integrated circuit. The method includes: referring to the layout data to extract a parameter that specifies a layout pattern around a target transistor included in the semiconductor integrated circuit, wherein the parameter includes at least a width of a device isolation structure around the target transistor; correcting a gate length and a gate width of the target transistor to offset a variation of a characteristic of the target transistor from a design value, the variation depending on the extracted parameter; and generating the mask data from the layout data in which the gate length and the gate width are corrected.

According to the present invention, it is possible to prevent the increase in the design/verification TAT for the semiconductor integrated circuit, while considering the peripheral pattern dependence of the transistor characteristics sufficiently.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a conceptual diagram for explaining the method of generating the LW modulation library according to the embodiment of the present invention;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Outline

According to the present embodiment, the peripheral pattern dependence of the transistor characteristics is considered. A layout pattern around (surrounding) a transistor is hereinafter referred to as "peripheral pattern" of the transistor. A parameter that specifies the peripheral pattern is hereinafter referred to as "peripheral parameter". The peripheral pattern of a transistor can be specified by various peripheral parameters.

Figure 5:
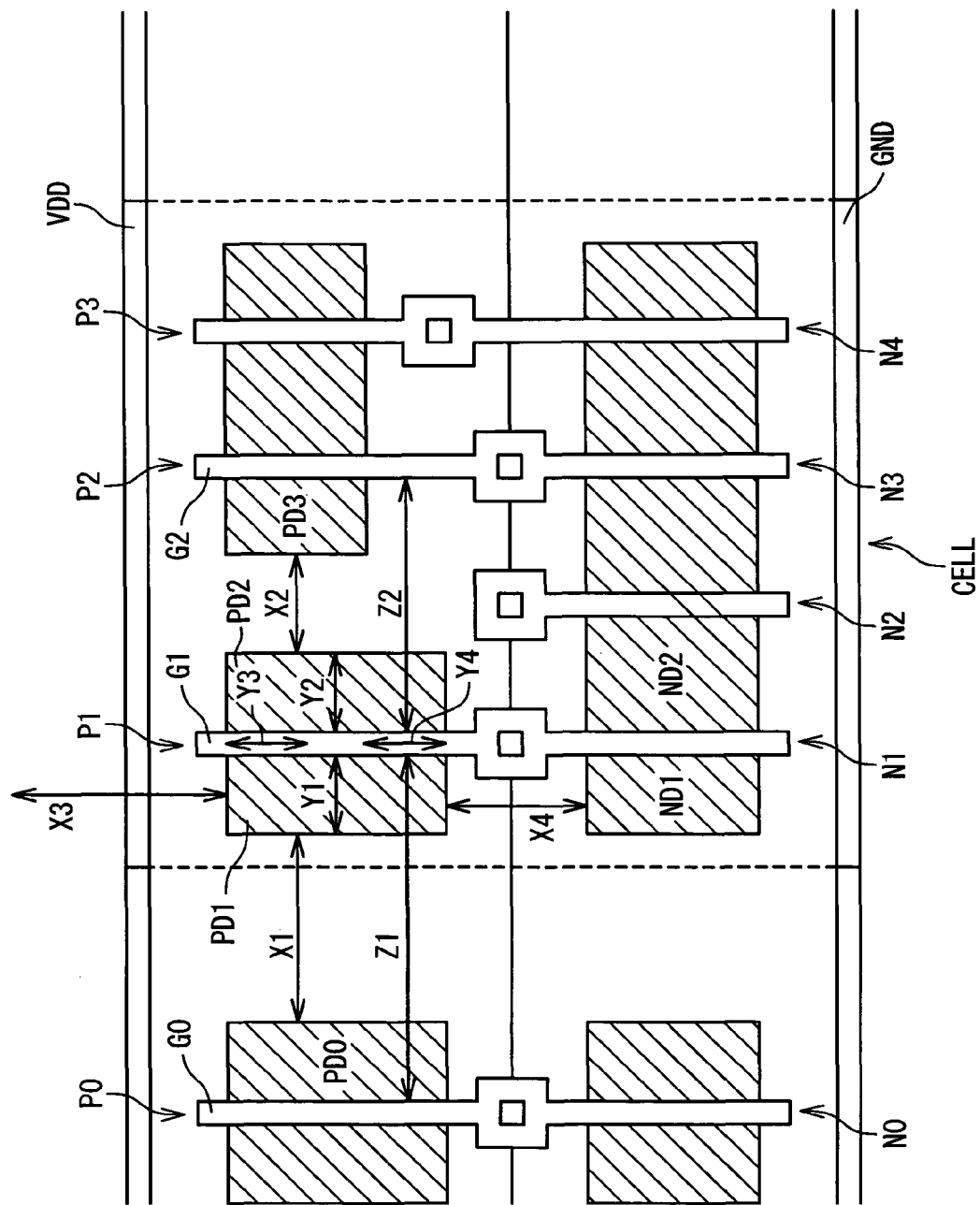
FIG. 5 is a plan view for explaining a peripheral pattern of a transistor that is considered in an embodiment of the present invention.

FIG. 5 is a plan view for explaining the peripheral parameter specifying the peripheral pattern. In FIG. 5, a cell (e.g. primitive cell such as a NAND gate and an inverter) has PMOS transistors P1 to P3 and NMOS transistors N1 to N4. The transistors P1 to P3 and N1 to N4 are formed in a region sandwiched between a power supply line VDD and a ground line GND. The PMOS transistors P1 and P3 and the NMOS transistors N1 and N4 are outermost transistors which are placed at the outermost in the cell, namely, placed near a cell boundary. On the other hand, the PMOS transistor P2 and the NMOS transistors N2 and N3 are placed at an inward area of the cell as compared with the outermost transistors. Moreover, the adjacent cell has a PMOS transistor P0 and a NMOS transistor N0, as shown in FIG. 5.

As an example, let us consider the PMOS transistor P1. The PMOS transistor P1 has a gate G1 and diffusion regions PD1 and PD2. The diffusion regions PD1 and PD2, which include source/drain and well, are surrounded by an STI that is a device isolation structure. The PMOS transistor P1 is formed on the diffusion regions PD1 and PD2. In FIG. 5, peripheral transistors adjacent to the PMOS transistor P1 include the PMOS transistor P0, the PMOS transistor P2 and the NMOS transistor N1.

One peripheral parameter associated with the PMOS transistor P1 is a distance to a diffusion region of a peripheral transistor. That is, a distance (inter-diffusion-region distance) between a diffusion region of the PMOS transistor P1 and a diffusion region of a peripheral transistor can be considered. The inter-diffusion-region distance is a distance between diffusion regions of adjacent transistors, which is equivalent to a width of a device isolation structure (STI) between the adjacent transistors. The STI stress imposed on the PMOS transistor P1 from the surrounding STI affects the mobility in a channel. When a width of the STI becomes narrower, the STI stress is increased, and thereby the mobility and the ON-current are changed. This is one example of the peripheral pattern dependence. Therefore, the STI width (inter-diffusion-region distance) around the PMOS transistor P1 is considered as the peripheral parameter.

In the example shown in FIG. 5, a peripheral parameter X1 is a distance between the diffusion region PD1 of the PMOS transistor P1 and a diffusion region PD0 of the PMOS transistor P0. A peripheral parameter X2 is a distance between the diffusion region PD2 of the PMOS transistor P1 and a diffusion region PD3 of the PMOS transistor P2. A peripheral parameter X3 is a distance between the diffusion region PD1 (or PD2) of the PMOS transistor P1 and a diffusion region of an upside peripheral transistor. A peripheral parameter X4 is a distance between the diffusion region PD1 (or PD2) of the PMOS transistor P1 and a diffusion region ND1 (or ND2) of the NMOS transistor N1.

Another peripheral parameter associated with the PMOS transistor P1 is a distance from an edge of an active region of the PMOS transistor P1 to an edge of the well, where the distance is referred to as a "well edge distance" hereinafter. The well edge distance is a peripheral parameter associated with the well proximity effect and affects the threshold voltage Vt of the PMOS transistor P1. In the example shown in FIG. 5, well edge distances Y1, Y2, Y3 and Y4 (left, right, up and down) are considered as the peripheral parameters.

Still another peripheral parameter is the gate pitch which affects the ON-current. The gate pitch is an interval between a gate of a certain transistor and a gate of the adjacent transistor. In the example shown in FIG. 5, a gate pitch Z1 is an interval between the gate G1 of the PMOS transistor P1 and a gate G0 of the PMOS transistor P0. A gate pitch Z2 is an interval between the gate G1 of the PMOS transistor P1 and a gate G2 of the PMOS transistor P2. These gate pitches Z1 and Z2 are considered as the peripheral parameters related to the PMOS transistor P1.

As described above, the peripheral parameters X1 to X4, Y1 to Y4, and Z1 to Z2 specify relationship between a layout pattern of the PMOS transistor P1 itself and the peripheral pattern. These peripheral parameters are associated with the peripheral pattern dependence and affect characteristics of the PMOS transistor P1. Similar peripheral parameters can be considered with respect to another transistor. In the present embodiment, the 10 kinds of peripheral parameters (X1 to X4, Y1 to Y4, and Z1 to Z2) are considered for each transistor. It should be noted that the peripheral parameter to be considered is not limited to them and can be selected arbitrarily.

Figure 6:
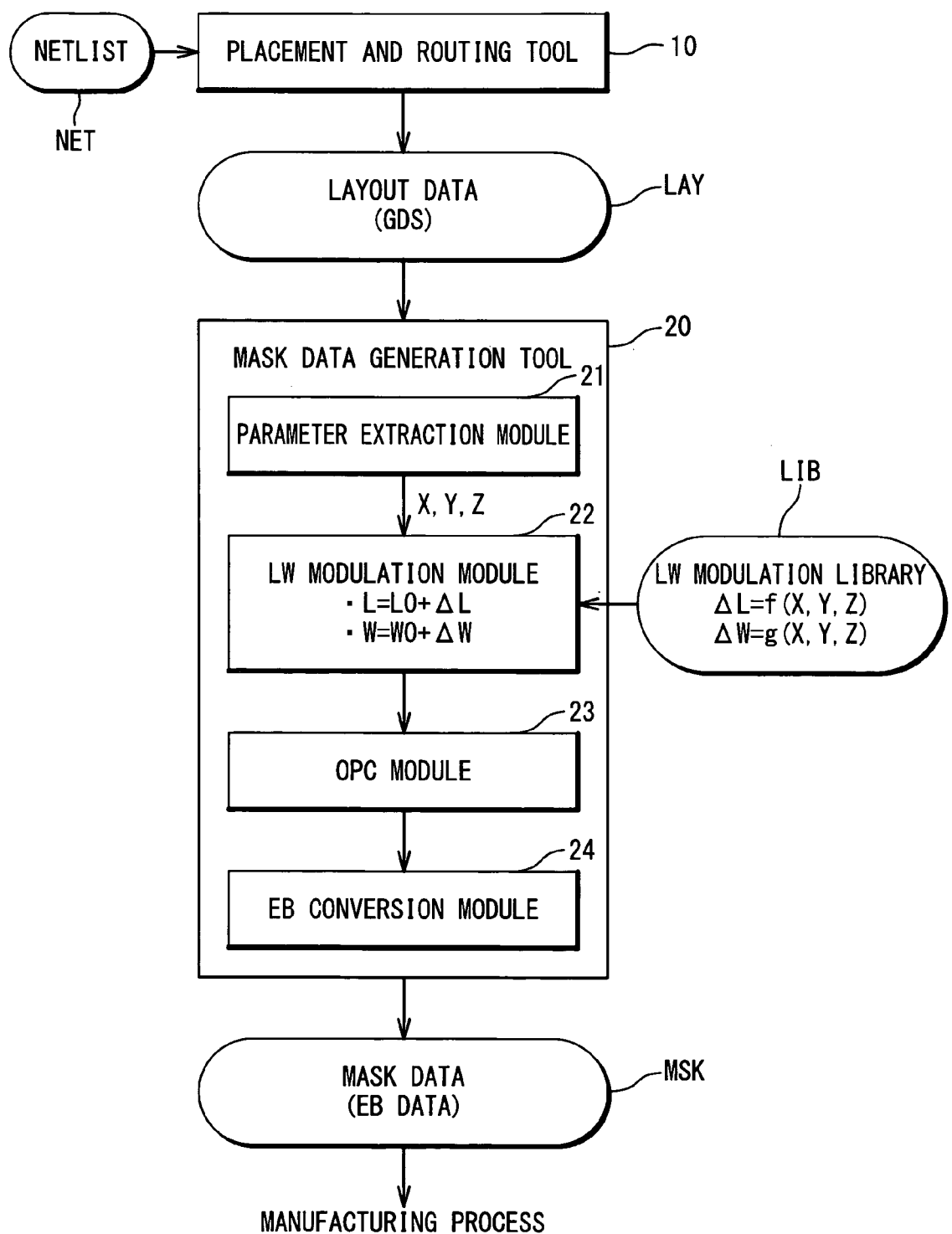
FIG. 6 is a block diagram showing a design flow for a semiconductor integrated circuit according to the embodiment of the present invention.
Figure 7:
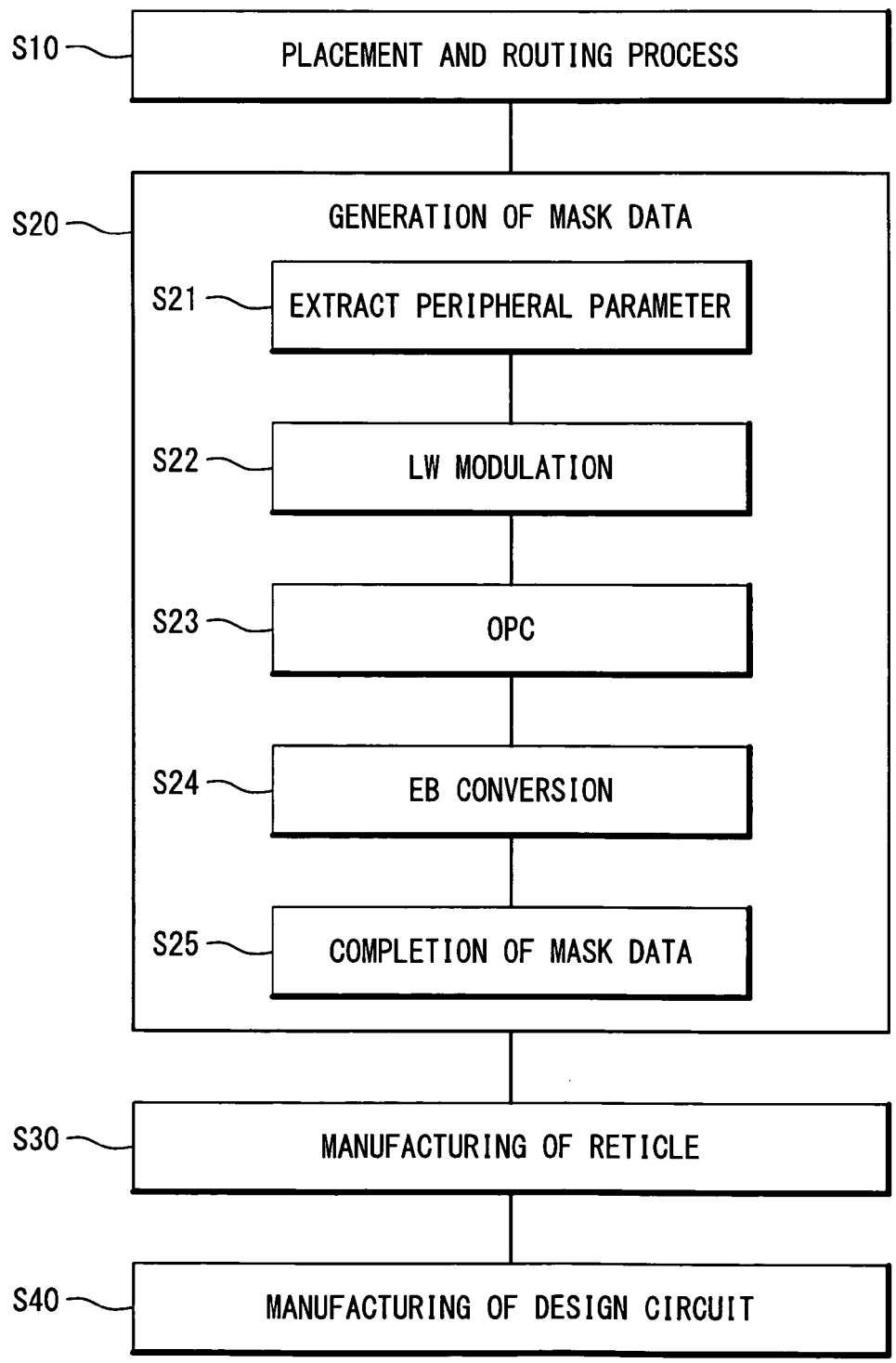
FIG. 7 is a flowchart showing a method of designing and manufacturing a semiconductor integrated circuit according to the embodiment of the present invention.

According to the present embodiment, the peripheral pattern dependence is considered during a stage of generating a mask data from a layout data of a design circuit. FIG. 6 and FIG. 7 are respectively a block diagram and a flowchart showing a design/manufacturing flow according to the present embodiment. Processing according to the present embodiment will be described with reference to FIG. 6 and FIG. 7.

Figure 2:
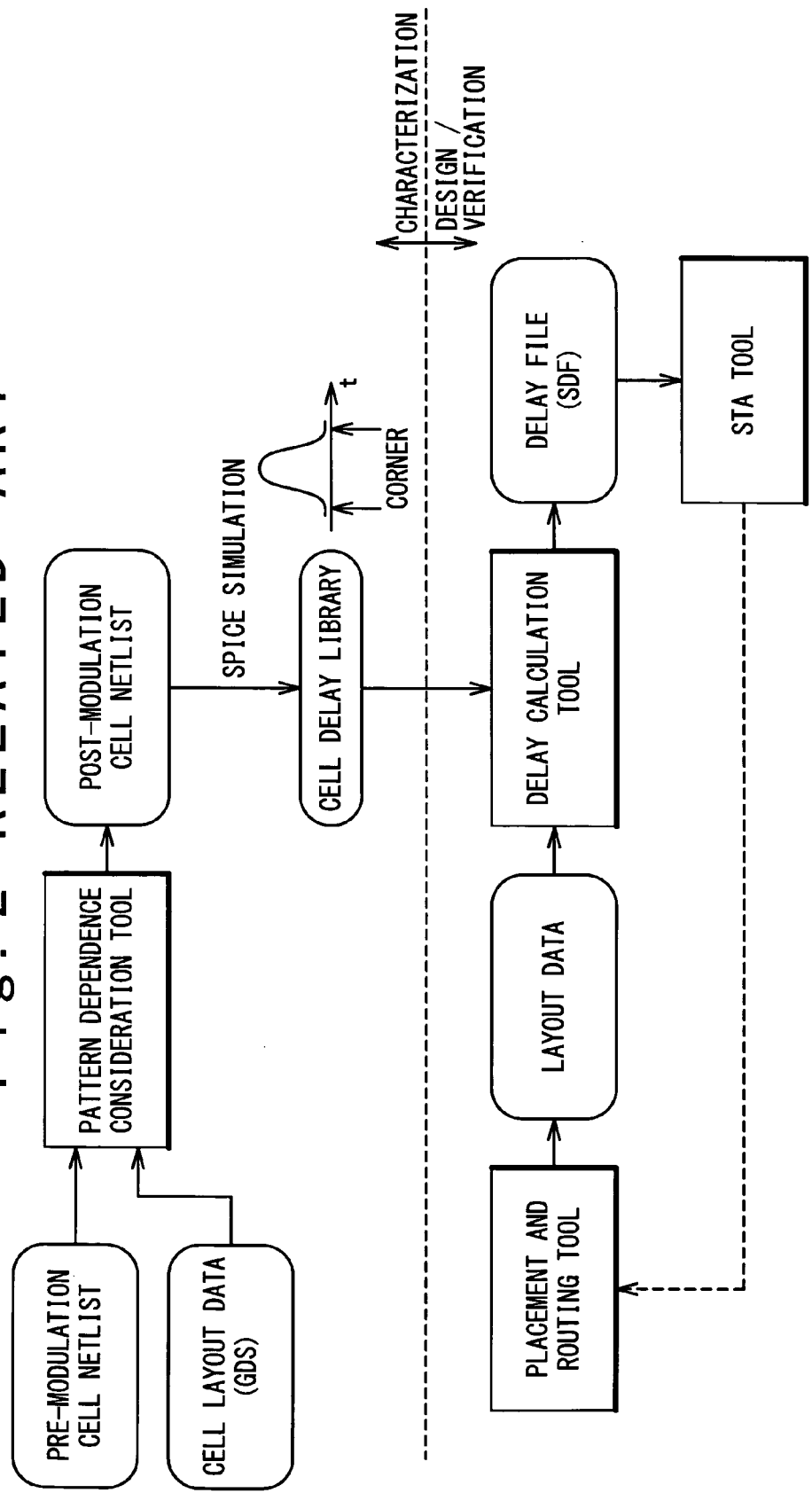
FIG. 2 is a schematic diagram showing a method of designing and verifying a semiconductor integrated circuit by utilizing the pattern dependence consideration tool.
Figure 3:
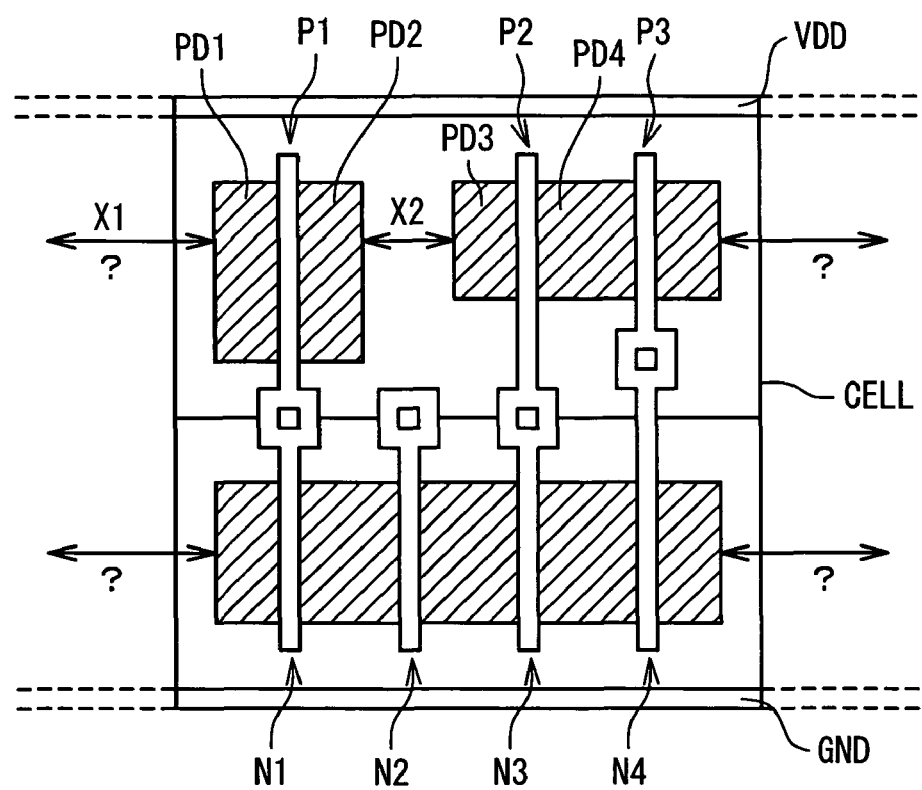
FIG. 3 is a plan view schematically showing one example of a cell layout.

Step S10:

The cell characterization is performed in accordance with a typical method. Alternatively, the peripheral pattern dependence may be considered with respect to transistors other than the outermost transistors in a cell, as shown in FIG. 2. Also, the circuit design/verification is performed in accordance with a typical method. More specifically, a placement and routing tool 10 performs cell placement and routing based on a netlist NET of the design circuit. As a result, a layout data LAY indicating a layout of the design circuit is generated. A format of the layout data LAY is GDS (Graphic Design System)-II format, for example.

Step S20:

Next, a mask data generation tool 20 reads the layout data LAY, and generates a mask data MSK of the design circuit based on the layout data LAY. The mask data MSK (EB data) is used by an electron beam writing system (EB writing system) when fabricating a reticle, and has a format that the electron beam writing system can recognize. According to the present embodiment, the peripheral pattern dependence is considered during this stage where the mask data MSK is generated from the layout data LAY. More specifically, the mask data generation tool 20 includes a parameter extraction module 21, a LW modulation module 22, an OPC module 23 and a EB conversion module 24, and these modules perform the following processing.

First, the parameter extraction module 21 refers to the layout data LAY to extract the peripheral parameters with respect to each transistor included in the design circuit (Step S21). In a case where the PMOS transistor P1 is an extraction-target transistor, for example, the parameter extraction module 21 extracts the peripheral parameters X1 to X4, Y1 to Y4 and Z1 to Z2 shown in FIG. 5 from the layout data LAY.

As described above, the extracted peripheral parameters are related to the peripheral pattern dependence, and the transistor characteristics depend on the extracted peripheral parameters. Actual transistor characteristics are supposed to vary from the design value (design value of the SPICE model) obtained at the cell characterization stage. The variation of the transistor characteristics from the design value depends on the peripheral parameters, and the variation is removed in Step S20. To this end, a gate length and a gate width of the target transistor are corrected (modulated) according to the present embodiment. That is to say, the variation of the transistor characteristics dependent on the peripheral parameters is cancelled (offset) by adjusting the gate length and the gate width instead of the peripheral parameters.

Correction values (modulation amounts) of the respective gate length and gate width required for offsetting the variation of the transistor characteristics are referred to as "LW modulation amounts" hereinafter. In order to offset (cancel) the variation of the transistor characteristics dependent on peripheral parameters, a correspondence relation between the peripheral parameters and the LW modulation amounts is necessary. The correspondence relation between the peripheral parameters and the LW modulation amounts is provided by LW modulation library LIB. More specifically, the LW modulation library LIB provides a "LW modulation function" that expresses the LW modulation amounts as a function of the peripheral parameters. For example, the LW modulation function is expressed as follows.

$$\Delta L = f(X1 \text{ to } X4, Y1 \text{ to } Y4, Z1 \text{ to } Z2)$$

$$\Delta W = g(X1 \text{ to } X4, Y1 \text{ to } Y4, Z1 \text{ to } Z2)$$

Here, $\Delta L$ is the modulation amount of the gate length, and $\Delta W$ is the modulation amount of the gate width. The LW modulation function may be given by an approximation formula or may be given in a table form. The LW modulation amounts ($\Delta L$, $\Delta W$) given by the LW modulation function are so calculated as to offset the variation of the transistor characteristics from the design value depending on the peripheral parameters. A method of generating the LW modulation library LIB (LW modulation function) will be described later in detail (see Section. 2).

The LW modulation module 22 first receives the peripheral parameters (X, Y, Z) that are extracted by the parameter extraction module 21. Then, the LW modulation module 22 refers to the LW modulation library LIB to obtain (calculate) the LW modulation amounts ($\Delta L$, $\Delta W$) corresponding to the extracted peripheral parameters. For example, the LW modulation module 22 calculates the LW modulation amounts by substituting the extracted peripheral parameters into the approximation formula provided by the LW modulation function. Alternatively, the LW modulation module 22 may calculate the LW modulation amounts by interpolating between table values. When the LW modulation amounts ($\Delta L$, $\Delta W$) are obtained, the LW modulation module 22 corrects (modulates) the gate length and gate width of the target transistor by using the obtained LW modulation amounts. Let us consider a case where a gate length and a gate width of the target transistor in the layout data LAY are L0 and W0, respectively. In this case, the gate length L and the gate width W after the correction procedure are expressed as follows.

$$L = L0 + \Delta L$$

$$W = W0 + \Delta W$$

In this manner, the LW modulation module 22 performs LW modulation for the target transistor, based on the extracted peripheral parameters and the LW modulation library LIB (Step S22). In other words, the LW modulation module 22 performs LW modulation for the target transistor so as to offset the variation of the transistor characteristics from the design value depending on the extracted peripheral parameters. The same processing is performed for each transistor included in the design circuit. If the peripheral pattern dependence has been considered with respect to transistors other than the outermost transistors in a cell at the cell characterization stage (refer to FIG. 2), only the outermost transistors may be considered as the target transistors in the Steps S21 and S22.

After that, in Step S23, the OPC module 23 performs the OPC (Optical Proximity Correction) with respect to the layout data LAY after the LW modulation. The OPC is the widely-known technique. It should be noted that the above-described Steps S21 and S22 are different from the OPC. Subsequently, in Step S24, the EB conversion module 24 converts the layout data LAY into the mask data (EB data) MSK by graphic analysis and graphic operation. The EB conversion processing also is widely-known technique. Consequently, the mask data MSK is completed (Step S25).

Step S30:

The electron beam writing system (EB writing system) reads the generated mask data MSK and creates a reticle (mask) corresponding to the mask data MSK.

Step S40:

The semiconductor integrated circuit thus designed is actually manufactured. In a photolithography process, the above-mentioned reticle is used. Since the mask data MSK is generated such that the characteristics variation caused by the peripheral pattern dependence is removed, the characteristics as designed can be obtained for the manufactured transistor.

According to the present embodiment, as described above, the LW modulation is carried out at the mask data generation stage. As a result, the variation of the transistor characteristics caused by the peripheral pattern dependence can be cancelled. It can be said that the characteristics variation caused by the peripheral pattern dependence is substituted with the LW modulation amounts. In other words, influence of the STI stress and the well proximity effect is represented by the LW modulation amounts. It is therefore possible to correct (modulate) the gate length and gate width at the mask data generation stage to offset (cancel) the influence of the peripheral pattern dependence.

According to the present embodiment, the peripheral pattern dependence of the transistor characteristics is fully considered. Thus, yield and reliability of the semiconductor integrated circuit to be manufactured are improved. Moreover, increase in the characterization TAT and the design/verification TAT can be prevented, because the peripheral pattern dependence is considered at the mask data generation stage.

Figure 4:
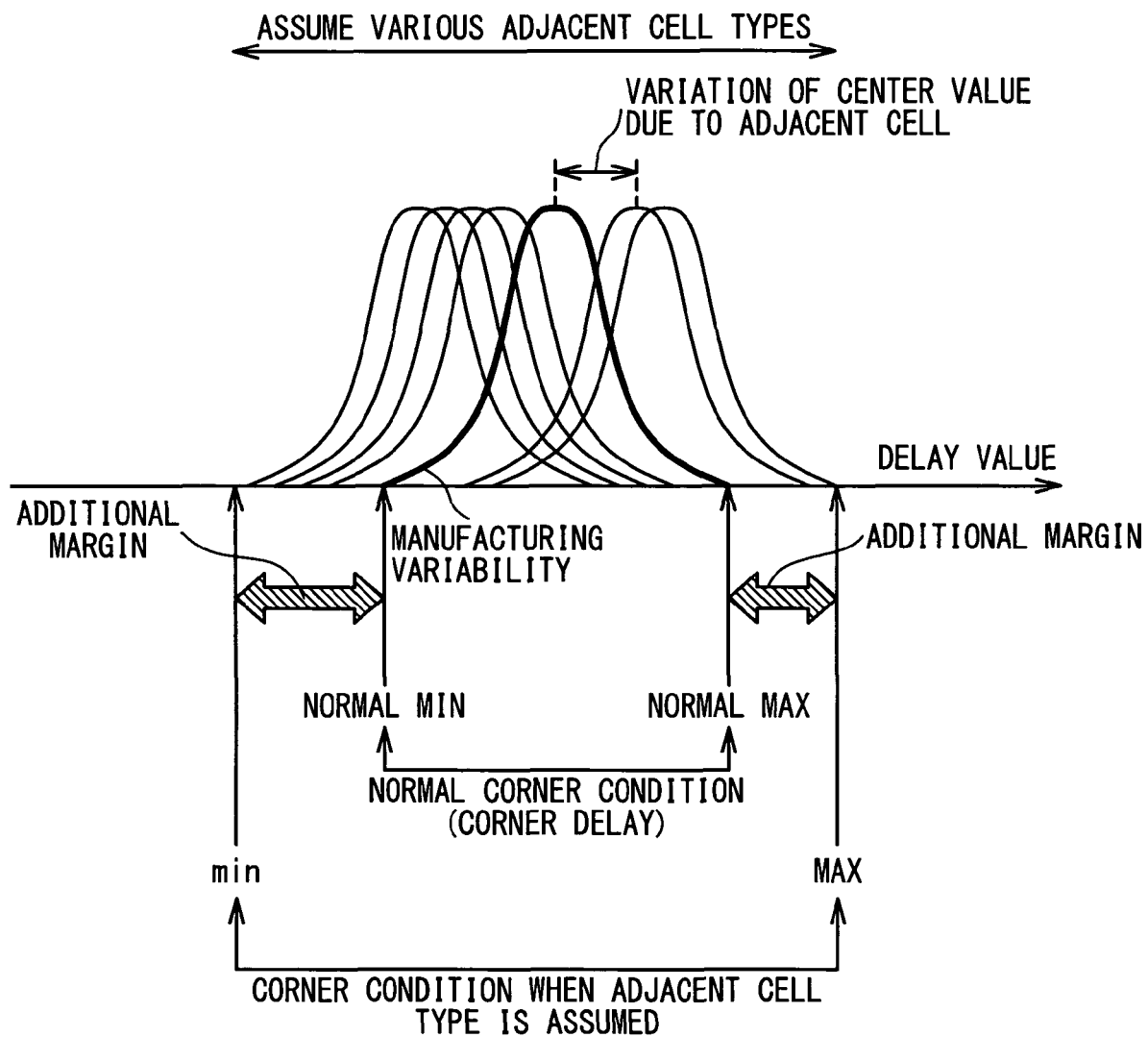
FIG. 4 is a schematic diagram showing corner delay values (corner conditions) provided by a cell delay library.

Furthermore, it is not necessary to add the margin such as shown in FIG. 4, since the peripheral pattern dependence needs not be considered at the cell characterization stage. As a result, the number of repetition times of the layout design and delay verification is prevented from being increased. Therefore, the increase in the design/verification TAT can be prevented. Moreover, it is not necessary to increase driving capability of transistors and/or to additionally insert redundant cells. Therefore, the increase in the chip area and power consumption can be prevented.

2. LW Modulation Library

Figure 8:
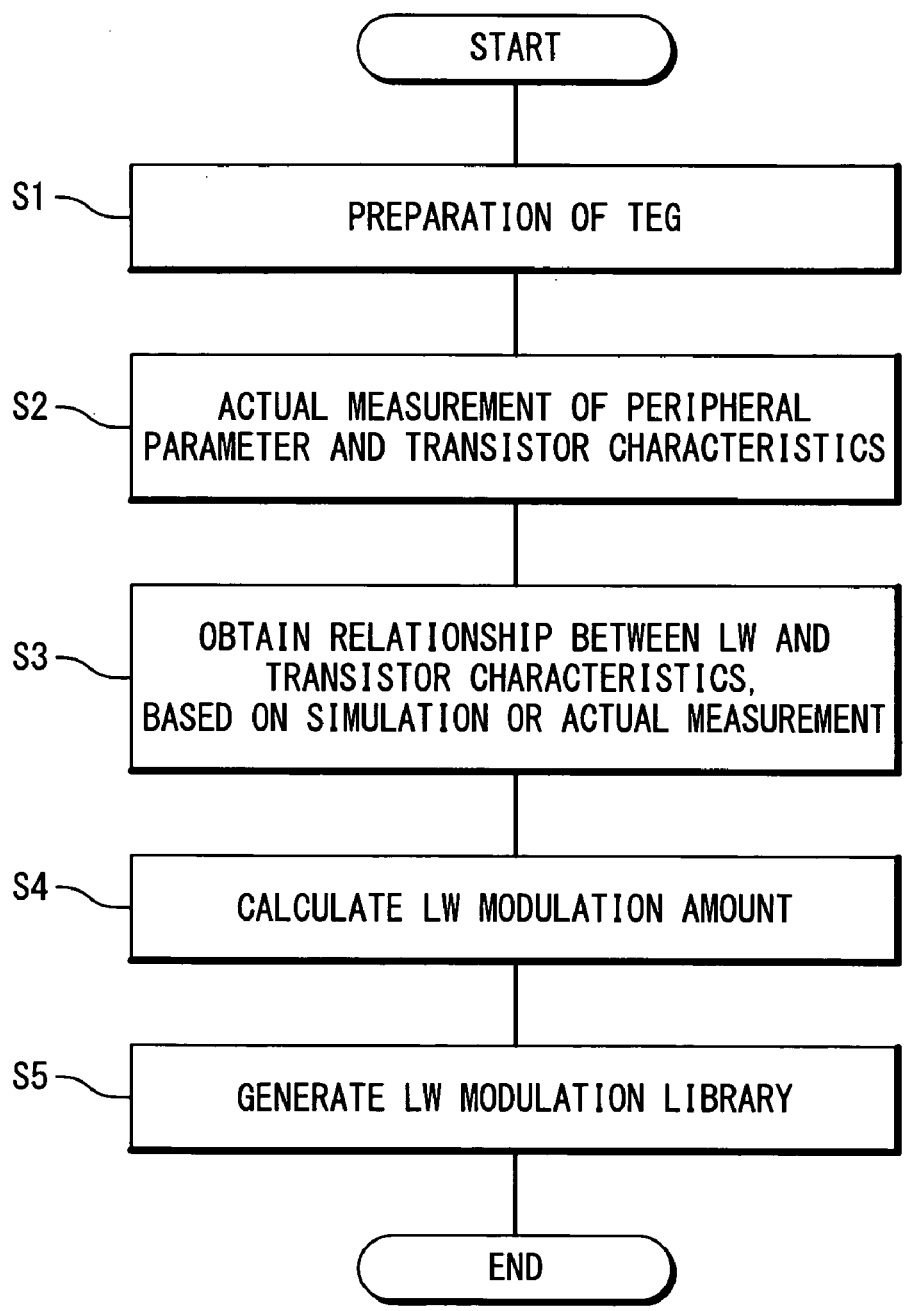
FIG. 8 is a flowchart showing a method of generating an LW modulation library according to the embodiment of the present invention.
Figure 10:
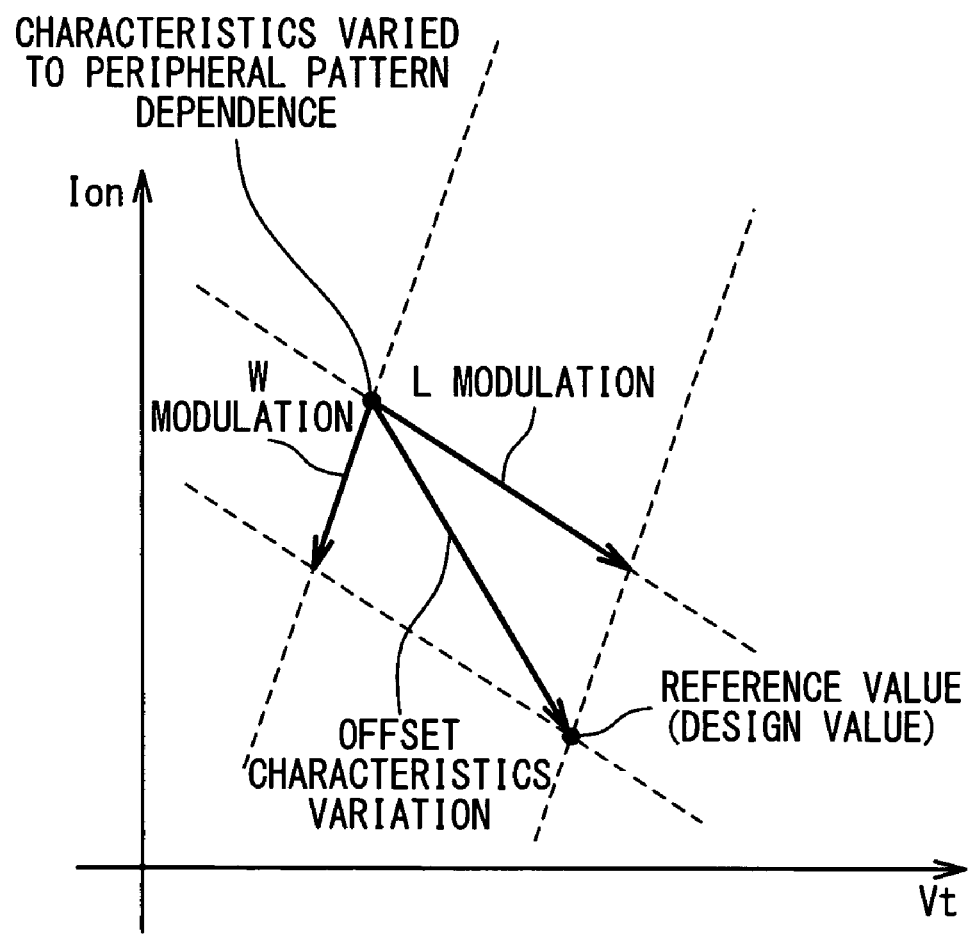
FIG. 10 is a conceptual diagram for explaining the method of generating the LW modulation library according to the embodiment of the present invention.

The LW modulation library LIB is created in advance of the circuit design. FIG. 8 is a flowchart showing a method of creating the LW modulation library LIB. FIGS. 9 and 10 are conceptual diagrams for explaining the creation method. An example of the creation of the LW modulation library LIB according to the present embodiment will be described with reference to FIGS. 8 to 10.

Step S1:

First, various TEGs (Test Element Groups) are prepared.

Step S2:

Next, the transistor characteristics and the peripheral parameters are actually measured by using the prepared TEGs. The transistor characteristics to be actually measured include ON-current Ion, threshold voltage Vt and the like. As a result, a measurement data indicating a correspondence relation between the transistor characteristics and the peripheral parameters can be obtained. In a graph in FIG. 9, a correspondence relation between the ON-current Ion and the peripheral parameter X is shown as an example. As shown in the graph, the ON-current Ion varies from a design value Ion0 of the ON-current Ion depending on the peripheral parameter X. For example, ON-current Ion(a) in a case where the peripheral parameter X is Xa is smaller than the design value Ion0 by $\Delta$Ion (=Ion0−Ion(a)). The variation $\Delta$Ion is the characteristics variation from the design value Ion0 that is caused by the peripheral pattern dependence.

Step S3:

Next, a correspondence relation between characteristics of a transistor and the gate length L and gate width W of the transistor is considered. A device data indicating the correspondence relation can be created through an actual measurement or a circuit simulation (e.g. SPICE). In a graph shown in FIG. 9, a correspondence relation between the ON-current Ion and the gate length L is shown as an example. Based on the correspondence relation, it is possible to calculate a rate of change of the ON-current Ion in response to change in the gate length L. A rage of change of the transistor characteristic in response to change in the gate width W can be calculated in a similar manner.

Step S4:

Based on the above-described measurement data and device data, it is possible to calculate the LW modulation amounts required for offsetting the characteristics variation. For example, in the case where the peripheral parameter X is Xa, the variation of the ON-current Ion(a) from the design value Ion0 is $\Delta$Ion. A modulation amount $\Delta$L of the gate length L required for cancelling the variation $\Delta$Ion can be calculated based on the variation $\Delta$Ion and the above-mentioned rate of change. In this manner, the peripheral parameter Xa can be related to the modulation amount $\Delta$L. When the peripheral parameter X is Xa, it is possible to match the ON-current Ion with the design value Ion0 by modulating the gate length L by the modulation amount $\Delta$L.

In practice, the LW modulation amounts $\Delta$L and $\Delta$W are calculated such that a plurality of transistor characteristics match the respective design values (reference values) as shown in FIG. 10. For example, the ON-current Ion and the threshold voltage Vt are considered in FIG. 10 as the plurality of transistor characteristics. From a view point of circuit operation, a delay time needs to match its design value, where sufficient accuracy is supposed to be obtained by considering the ON-current Ion and the threshold voltage Vt. As the gate width W is increased, the ON-current Ion is increased and the threshold voltage Vt is increased. As the gate length L is increased, the ON-current Ion is decreased and the threshold voltage Vt is increased. Based on the rate of change, the LW modulation amounts $\Delta$L and $\Delta$W required for offsetting the variation of the transistor characteristics can be calculated. In other words, a correspondence relation between the peripheral parameters and the LW modulation amounts $\Delta$L, $\Delta$W can be obtained.

With regard to the LW modulation amounts, a certain permissible range (modulation limit value) may be set in order to prevent open/short and short channel effect. For example, if the modulation amount $\Delta$W of the gate width W reaches the modulation limit, only the gate length L is adjusted thereafter. If not all the transistor characteristics can be adjusted to the respective design values, priority is given to the ON-current Ion. The reason is that effect of the ON-current Ion on the delay value is larger than that of the threshold voltage Vt. It should be noted that the transistor characteristics considered in FIG. 10 are not limited to the ON-current Ion and the threshold voltage Vt. Other transistor characteristics may be considered. Moreover, it is not necessarily required to completely match the plurality of transistor characteristics with the respective reference values, and the plurality of transistor characteristics as a whole may be adjusted to near the respective reference values.

Step S5:

By the above-described method, optimum LW modulation amounts $\Delta$L and $\Delta$W are calculated with respect to each of various patterns of the peripheral parameters. Therefore, modeling of the LW modulation amounts $\Delta$L, $\Delta$W is possible. That is, it is possible to generate a LW modulation function that expresses the LW modulation amounts $\Delta$L, $\Delta$W as a function of the peripheral parameters. In a case where an approximation formula is used as the model, for example, coefficients of the approximation formula can be determined by a fitting procedure using the actual measurement values of the peripheral parameters and the calculated LW modulation amounts. Consequently, the LW modulation function can be created (see FIG. 9).

The LW modulation library LIB provides the LW modulation function. The LW modulation library LIB (LW modulation function) may be given by the approximation formula or may be given by a table. In either case, the LW modulation library LIB is so created as to indicate the correspondence relation between the peripheral parameters and the LW modulation amounts. It is therefore possible at the time of generating the mask data to perform the above-described LW modulation based on the peripheral parameters extracted from the layout data LAY and the LW modulation library LIB.

3. Modification Example

Figure 1:
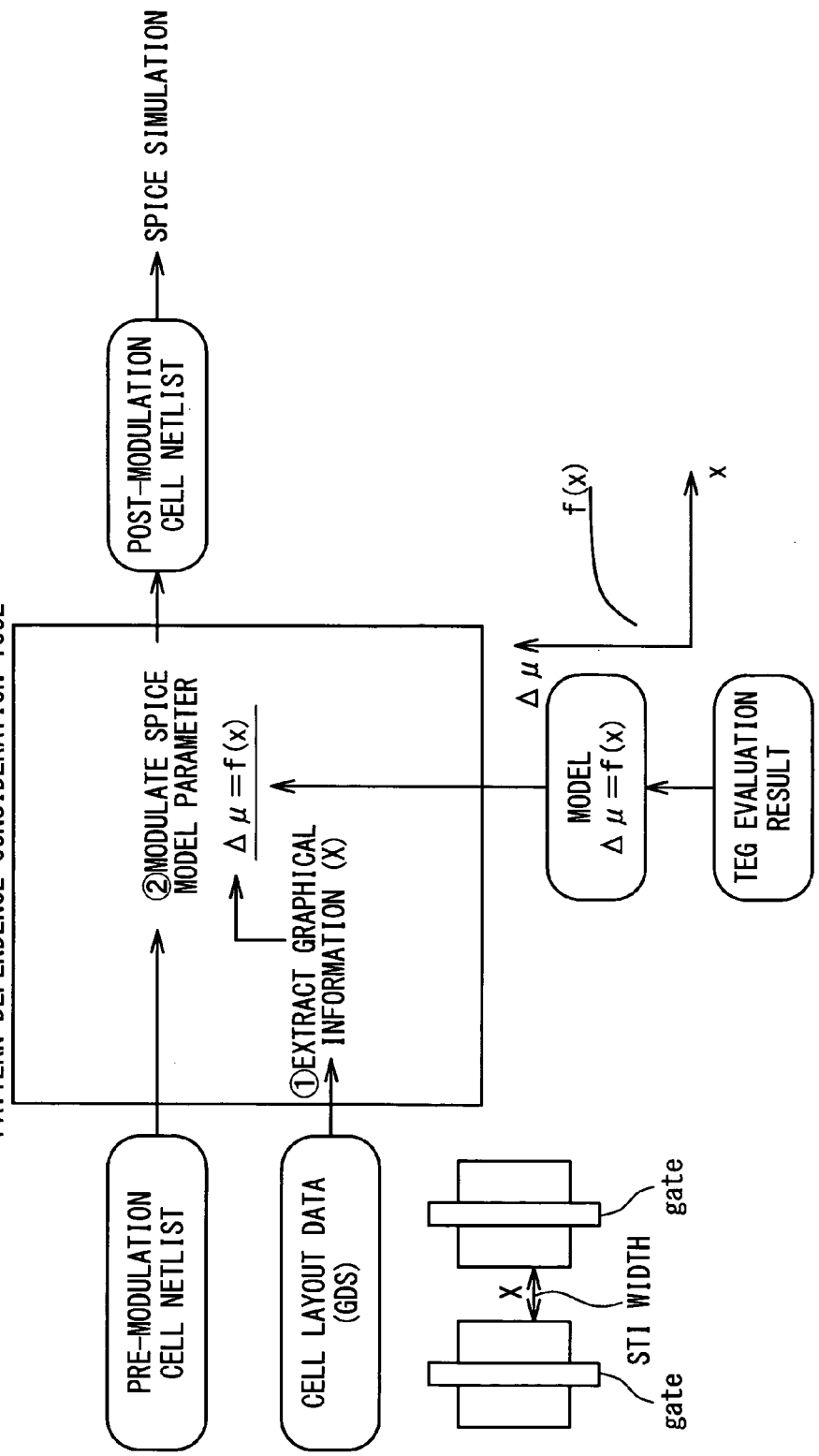
FIG. 1 is a schematic diagram for explaining a function of a pattern dependence consideration tool.
Figure 11:
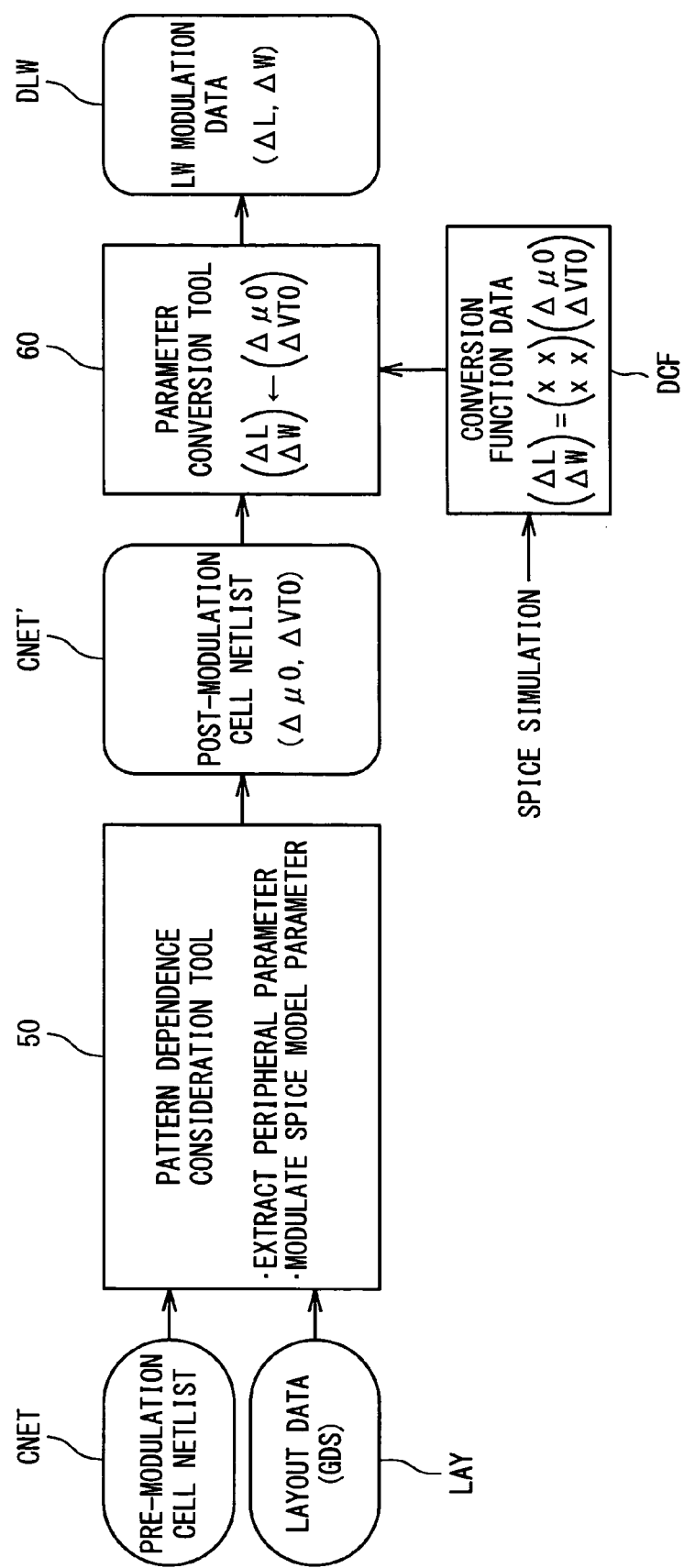
FIG. 11 is a block diagram for explaining a modification example of a method of calculating LW modulation amounts.

A method of the LW modulation is not limited to the above-described one. For example, the pattern dependence consideration tool explained in FIG. 1 can be utilized in calculating the LW modulation amounts ($\Delta L$, $\Delta W$). FIG. 11 is a block diagram for explaining a modification example of a method of calculating the LW modulation amounts. In the modification example, a pattern dependence consideration tool 50 and a parameter conversion tool 60 are used for calculating the LW modulation amounts.

First, the pattern dependence consideration tool 50 modulates SPICE model parameters based on the chip-level layout data LAY. More specifically, the pattern dependence consideration tool 50 reads a pre-modulation cell netlist CNET and the layout data LAY, and extracts the peripheral parameters (X1 to X4, Y1 to Y4, Z1 to Z2) of each transistor from the layout data LAY. Subsequently, the pattern dependence consideration tool 50 modulates SPICE model parameters included in the pre-modulation cell netlist CNET based on the extracted peripheral parameters. As a result, a post-modulation cell netlist CNET' is generated.

For example, the pattern dependence consideration tool 50 modulates mobility $\mu 0$ and threshold voltage VT0 that are SPICE model parameters. The modulation amounts of the mobility $\mu 0$ and the threshold voltage VT0 are $\Delta \mu 0$ and $\Delta VT0$, respectively. The pattern dependence consideration tool 50 outputs the post-modulation cell netlist CNET' in which the modulation amounts $\Delta \mu 0$ and $\Delta VT0$ are reflected. Alternatively, the pattern dependence consideration tool 50 may directly output the modulation amounts $\Delta \mu 0$ and $\Delta VT0$. The modulation amounts $\Delta \mu 0$ and $\Delta VT0$ are obtained by considering the peripheral pattern dependence. Therefore, transistor characteristics corresponding to the extracted peripheral parameters can be obtained (realized) in the SPICE simulation using the post-modulation SPICE model parameters.

The parameter conversion tool 60 obtains the modulation amounts $\Delta \mu 0$ and $\Delta VT0$ of the SPICE model parameters from the output from the pattern dependence consideration tool 50. Then, the parameter conversion tool 60 converts the modulation amounts ($\Delta \mu 0$, $\Delta VT0$) of the model parameters into the LW modulation amounts ($\Delta L$, $\Delta W$). At this time, the parameter conversion tool 60 performs the parameter conversion by using a "conversion function" provided by a conversion function data DCF. The conversion function is expressed as follows.

$$\begin{pmatrix} \Delta L \\ \Delta W \end{pmatrix} = \begin{pmatrix} \frac{\partial Ion}{\partial L} & \frac{\partial Ion}{\partial W} \\ \frac{\partial Vt}{\partial L} & \frac{\partial Vt}{\partial W} \end{pmatrix}^{-1} \begin{pmatrix} \frac{\partial Ion}{\partial \mu o} & \frac{\partial Ion}{\partial VTO} \\ \frac{\partial Vt}{\partial \mu o} & \frac{\partial Vt}{\partial VTO} \end{pmatrix} \begin{pmatrix} \Delta \mu o \\ \Delta VTO \end{pmatrix}$$

The conversion function can be created through a SPICE simulation of the transistor characteristics, for example. More specifically, a variation of the transistor characteristics (e.g. Ion, Vt) corresponding to the modulation amounts ($\Delta \mu 0$, $\Delta VT0$) of the SPICE model parameters is calculated through the SPICE simulation. It should be noted here that "Vt" indicates an electrical characteristic, while "VT0" indicates a SPICE model parameter. Subsequently, LW modulation amounts ($\Delta L$, $\Delta W$) with which the calculated variation of the transistor characteristics can be obtained are calculated through the SPICE simulation. Alternatively, LW modulation amounts ($\Delta L$, $\Delta W$) are so calculated as to offset (cancel) the variation of the transistor characteristics.

By the above-described method, the LW modulation amounts ($\Delta L$, $\Delta W$) are calculated with respect to each of various patterns of the modulation amounts ($\Delta \mu 0$, $\Delta VT0$). Then, modeling of the LW modulation amounts is performed. Consequently, the conversion function that expresses the LW modulation amounts ($\Delta L$, $\Delta W$) as a function of the modulation amounts ($\Delta \mu 0$, $\Delta VT0$) of the model parameters is created.

The parameter conversion tool 60 converts the output of the pattern dependence consideration tool 50 into the LW modulation amounts ($\Delta L$, $\Delta W$) by using the conversion function. The same processing is repeated, and the LW modulation amounts ($\Delta L$, $\Delta W$) is calculated for each transistor include in the design circuit. As a result, a LW modulation data DLW indicating a correspondence relation between each transistor and the LW modulation amounts ($\Delta L$, $\Delta W$) is generated.

The processing by the parameter conversion tool 60 also means replacement of the characteristics variation caused by the peripheral pattern dependence by the LW modulation amounts. That is to say, influence of the STI stress and the well proximity effect is substituted with the LW modulation amounts.

Figure 12:
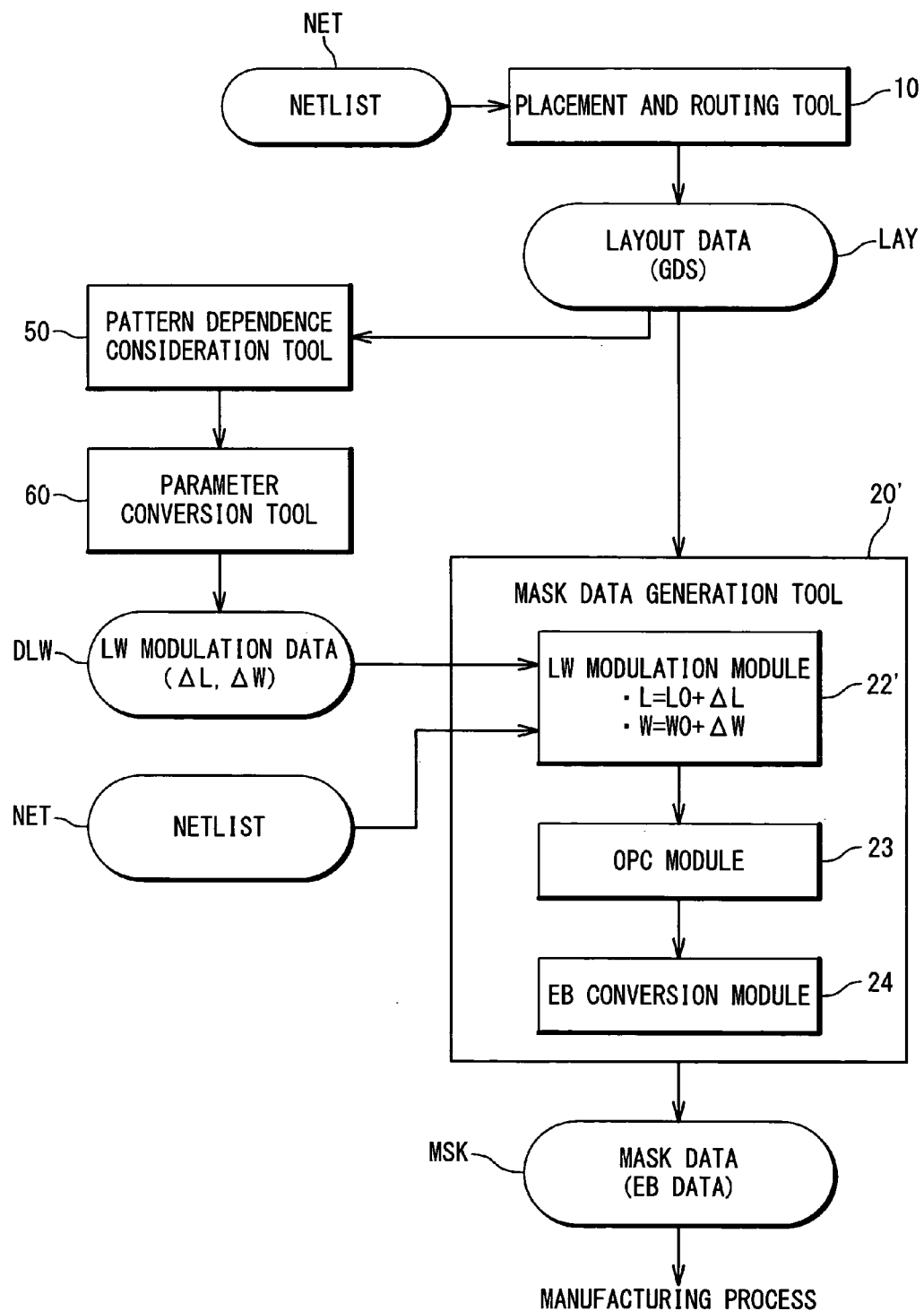
FIG. 12 is a block diagram showing a design flow for a semiconductor integrated circuit, to which the modification example is applied.
Figure 13:
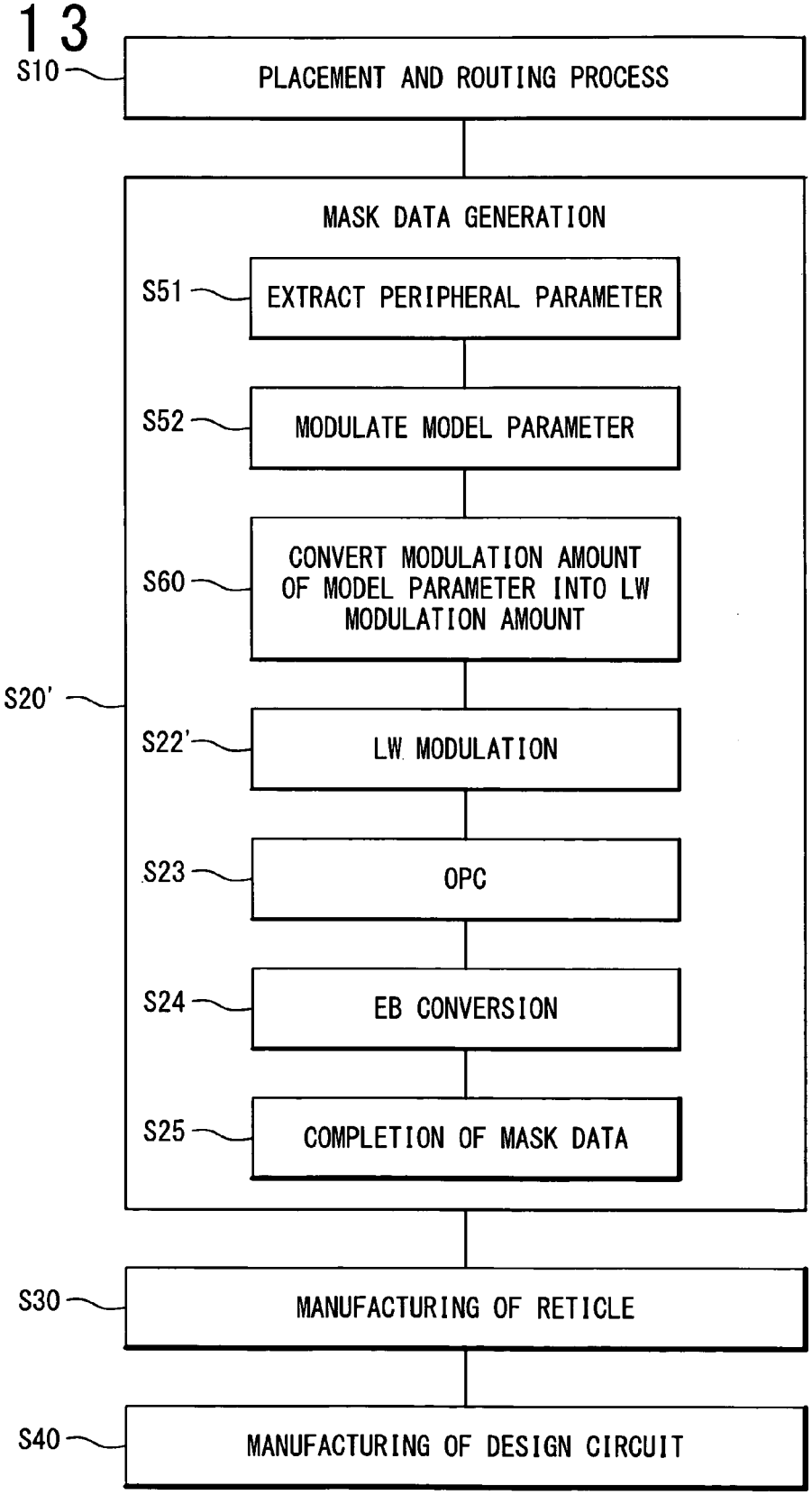
FIG. 13 is a flowchart showing a method of designing and manufacturing a semiconductor integrated circuit, to which the modification example is applied.

The method shown in FIG. 11 may be applied to the generation of the LW modulation library LIB. Moreover, the method can be incorporated in parallel into the mask data generation procedure. FIG. 12 and FIG. 13 are respectively a block diagram and a flowchart showing a design/manufacturing flow to which the present modification example is applied. Processing according to the present modification example will be described with reference to FIG. 12 and FIG. 13. An overlapping description will be omitted as appropriate.

After the layout data LAY is generated, the mask data MSK is generated from the layout data LAY (Step S20'). At this time, the peripheral pattern dependence is considered. First, the peripheral parameters are extracted from the layout data LAY, as in the above-described Step S21. In the present example, the peripheral parameters are extracted by the pattern dependence consideration tool 50 (Step S51). The pattern dependence consideration tool 50 modulates the SPICE model parameters based on the extracted peripheral parameters (Step S52). Next, the parameter conversion tool 60 converts the output of the pattern dependence consideration tool 50 into the LW modulation amounts to generate the LW modulation data DLW (Step S60). The LW modulation data DLW indicates the correspondence relation between each transistor and the LW modulation amounts.

Meanwhile, a mask data generation tool 20' reads the netlist NET, the layout data LAY and the LW modulation data DLW. Then, the mask data generation tool 20' performs the LW modulation without performing the peripheral parameter extraction (Step S22'). More specifically, a LW modulation module 22' specifies a transistor included in the design circuit, based on the netlist NET and the layout data LAY. Next, the LW modulation module 22' obtains the LW modulation amounts related to the specified transistor from the LW modulation data DLW. Then, the LW modulation module 22' performs the LW modulation of the transistor based on the obtained LW modulation amounts. The subsequent procedures are the same.

According to the present modification example, the LW modulation library LIB is not necessary.

4. Design System

Figure 14:
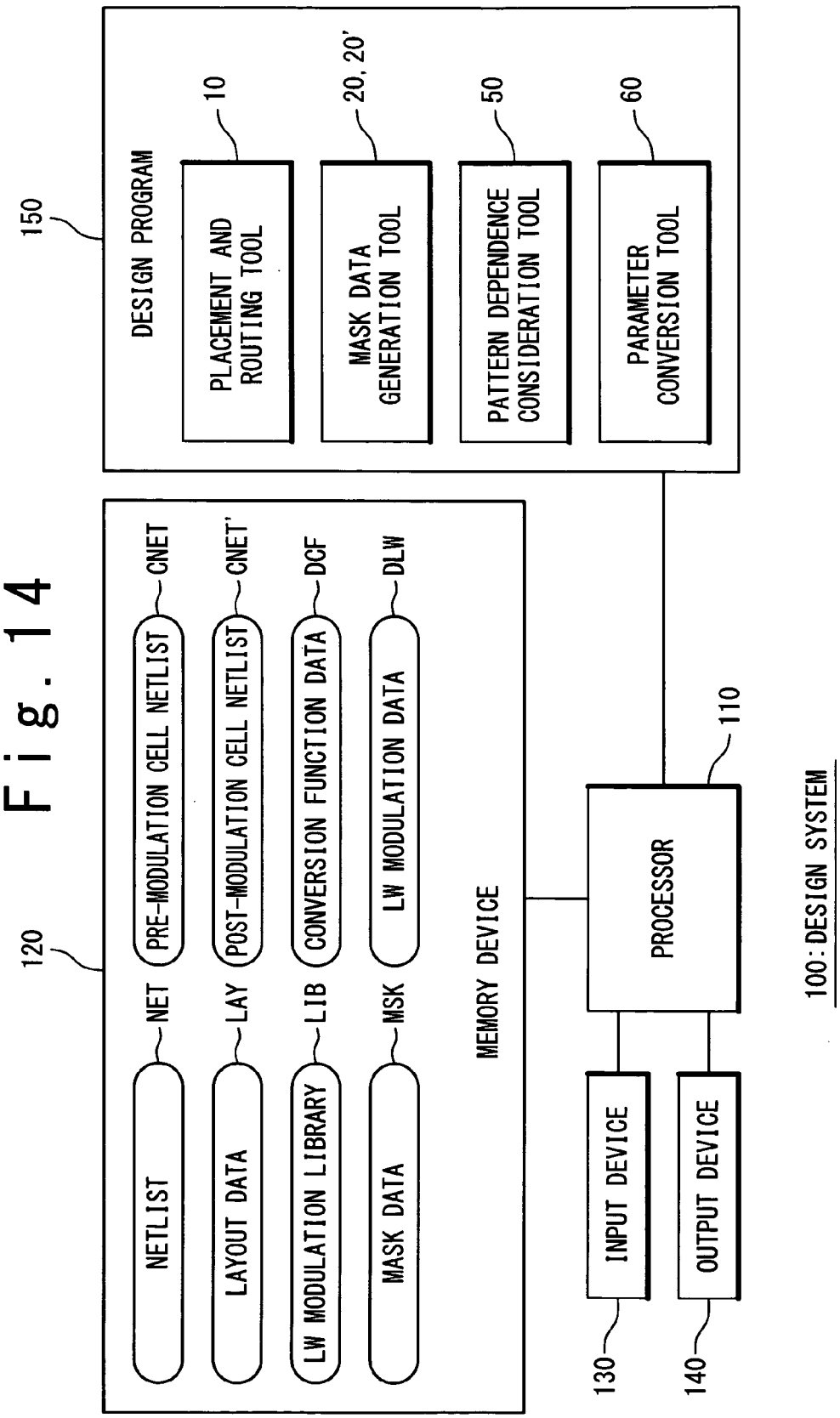
FIG. 14 is a block diagram showing a configuration example of a design system according to the embodiment of the present invention.

The design method for a semiconductor integrated circuit according to the present embodiment can be achieved by a computer system. FIG. 14 is a block diagram showing a configuration example of a design system 100 according to the present embodiment. The design system 100 is provided with a processor 110, a memory device 120, an input device 130, an output device 140 and a design program 150. The memory device 120 includes a RAM and an HDD. The input device 130 includes a key board and a mouse. The output device 140 includes a display.

Stored in the memory device 120 are the netlist NET, the layout data LAY, the LW modulation library LIB, the mask data MSK, the pre-modulation cell netlist CNET, the post-modulation cell netlist CNET', the conversion function data DCF, the LW modulation data DLW and so forth.

The design program 150 is software program executed by the processor 110. The design program 150 may be recorded on a computer-readable recording medium. The design program 150 may be stored in the memory device 120. The design program 150 includes the placement and routing tool 10, the mask data generation tool 20, 20', the pattern dependence consideration tool 50, the parameter conversion tool 60 and so forth.

The processor 110 executes the respective tools of the design program 150 to achieve the data processing. Each tool reads necessary data and files from the memory device 120 and writes generated data and files to the memory device 120. Consequently, the above-mentioned processing according to the present embodiment is achieved.

It is apparent that the present invention is not limited to the above embodiments and may be modified and changed without departing from the scope and spirit of the invention.

What is claimed is:

1. A method of designing a semiconductor integrated circuit comprising:
generating, via a computer, a layout data indicating a layout of said semiconductor integrated circuit; and
generating, via the computer, a mask data of said semiconductor integrated circuit based on said layout data,
wherein said generating the mask data comprises:
referring to said layout data to extract a parameter that specifies a layout pattern around a target transistor included in said semiconductor integrated circuit, wherein said parameter includes at least a width of a device isolation structure around said target transistor;
correcting a gate length and a gate width of said target transistor to offset a variation of a characteristic of said target transistor from a design value, said variation depending on said extracted parameter; and
generating said mask data from said layout data in which said gate length and said gate width are corrected.

2. The method according to claim 1,
wherein said parameter further includes a distance from an edge of an active region of said target transistor to an edge of a well on which said target transistor is formed.

3. A method of designing a semiconductor integrated circuit comprising:
generating, via a computer, a layout data indicating a layout of said semiconductor integrated circuit; and
generating, via the computer, a mask data of said semiconductor integrated circuit based on said layout data,
wherein said generating the mask data comprises:
referring to said layout data to extract a parameter that specifies a layout pattern around a target transistor included in said semiconductor integrated circuit, wherein said parameter includes at least a width of a device isolation structure around said target transistor;
correcting a gate length and a gate width of said target transistor to offset a variation of a characteristic of said target transistor from a design value, said variation depending on said extracted parameter; and
generating said mask data from said layout data in which said gate length and said gate width are corrected; and
generating, via the computer, an LW modulation library that indicates correspondence relation between said parameter and correction values of a gate length and a gate width, wherein said correction values are so calculated as to offset a variation of a transistor characteristic from a design value depending on said parameter,
wherein said correcting comprises:
referring to said LW modulation library to obtain said correction values corresponding to said extracted parameter; and
correcting said gate length and said gate width of said target transistor by using said obtained correction values.

4. The method according to claim 3,
wherein said generating the LW modulation library comprises:
performing an actual measurement of said parameter and said transistor characteristic;
calculating, through a circuit simulation or an actual measurement, a rate of change of said transistor characteristic in response to change in a gate length and a gate width;
calculating said correction values required for offsetting a variation of the actual measurement value of said transistor characteristic from said design value, based on said rate of change; and
generating said LW modulation library such that said LW modulation library indicates correspondence relation between said parameter and said calculated correction values.

5. The method according to claim 4,
wherein said transistor characteristic includes threshold voltage and ON-current.

6. The method according to claim 3,
wherein said LW modulation library is given by an approximation formula or a table.

7. A method of designing a semiconductor integrated circuit comprising:
generating, via a computer, a layout data indicating a layout of said semiconductor integrated circuit; and
generating, via the computer, a mask data of said semiconductor integrated circuit based on said layout data,
wherein said generating the mask data comprises:
referring to said layout data to extract a parameter that specifies a layout pattern around a target transistor included in said semiconductor integrated circuit, wherein said parameter includes at least a width of a device isolation structure around said target transistor;
correcting a gate length and a gate width of said target transistor to offset a variation of a characteristic of said target transistor from a design value, said variation depending on said extracted parameter; and
generating said mask data from said layout data in which said gate length and said gate width are corrected,
wherein said correcting comprises:
modulating a model parameter of said target transistor such that a characteristic of said target transistor corresponding to said extracted parameter is obtained in a circuit simulation;
converting the modulation amount of said model parameter into respective modulation amounts of a gate length and a gate width; and correcting said gate length and said gate width of said target transistor based on said respective modulation amounts of said gate length and said gate width.

8. The method according to claim 7, further comprising:
performing a circuit simulation of a transistor characteristic of a transistor to calculate respective modulation amounts of a gate length and a gate width of said transistor with which a variation of said transistor characteristic depending on modulation of a model parameter of said transistor is obtained; and
generating a conversion function that expresses said calculated respective modulation amounts as a function of the modulation amount of said model parameter,
wherein said conversion function is used in said converting the modulation amount of said model parameter.

9. A non-transistory computer-readable medium storing a mask data generation program the program, when executed, causes a computer to perform a method of generating a mask data from a layout data of a semiconductor integrated circuit, the method comprising:

referring to said layout data to extract a parameter that specifies a layout pattern around a target transistor included in said semiconductor integrated circuit, wherein said parameter includes at least a width of a device isolation structure around said target transistor;
correcting a gate length and a gate width of said target transistor to offset a variation of a characteristic of said target transistor from a design value, said variation depending on said extracted parameter; and
generating said mask data from said layout data in which said gate length and said gate width are corrected.

10. The non-transistory computer-readable medium according to claim 9,
wherein said parameter further includes a distance from an edge of an active region of said target transistor to an edge of a well on which said target transistor is formed.

* * * * *